United States Patent [19]

Hill et al.

[11] Patent Number: 4,628,277
[45] Date of Patent: Dec. 9, 1986

[54] FEMTOAMMETER

[75] Inventors: William D. Hill, San Jose; David D. Akers, Los Gatos, both of Calif.

[73] Assignee: General Electric Company, San Jose, Calif.

[21] Appl. No.: 729,455

[22] Filed: May 1, 1985

[51] Int. Cl.$^4$ ............................................... H03F 1/34
[52] U.S. Cl. .................................. 330/110; 324/105; 324/123 C; 330/289
[58] Field of Search ............... 324/105, 123 C, 123 R; 330/110, 289; 340/347 M; 174/16 HS

[56] References Cited

U.S. PATENT DOCUMENTS 3,724,954  4/1973  Dreyfoos, Jr. ................ 324/10 S X
4,270,090  5/1981  Williams ...................... 324/123 C X
4,349,788  9/1982  Sondermeyer .................. 330/110 X

FOREIGN PATENT DOCUMENTS 1804389  7/1970  Fed. Rep. of Germany ...... 330/110
1007874  10/1965  United Kingdom ............... 330/110

OTHER PUBLICATIONS

Rao, K. G. Krishna, "Log Amp's Range Extended to lpA", *Electronic Design* 14, Jul. 5, 1976, p. 66.

*Primary Examiner*—Eugene R. LaRoche
*Assistant Examiner*—Steven J. Mottola
*Attorney, Agent, or Firm*—Ivor J. James, Jr.; Raymond G. Simkins

[57] ABSTRACT

A femtoammeter is disclosed which resists noise induced reversed bias of the ammeter amplifier and avoids long time constant recovery with unusually high measurement accuracy. The amplifier ammeter has a feedback loop which is provided with paired opposingly faced log diodes in parallel across the feedback circuit. Transients of negative or positive bias are accommodated without biasing the amplifier to a reverse polarity and having unacceptably long time constant recovery. Conventional temperature compensation, not possible with the parallel reversed diode configuration, is supplied by heat sinking the ammeter components, providing a log diode temperature sensor for the heat sinked components and controlling the heat sink operating temperature with a thermoelectric cooler. The temperature sensing log diodes output to a computer lookup table. The same temperature sensing log diode outputs to a bridge circuit operating the thermoelectric cooler. The thermoelectric cooler is polarized to heat or cool the heat sink to thermally adjust the ammeter to an optimum operating temperature. Automated bootstrap calibration is disclosed with reed switching for prevention of stray currents. Accuracy includes heretofore unattainable results.

7 Claims, 6 Drawing Figures

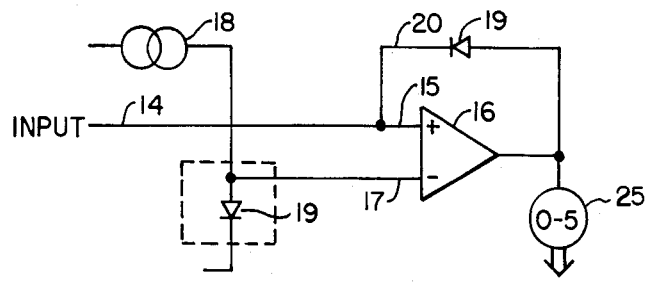
FIG._1. (PRIOR ART)
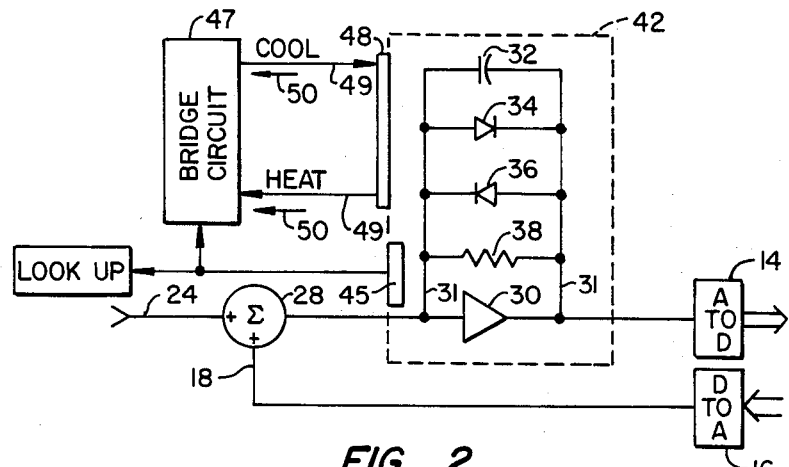
FIG._2.
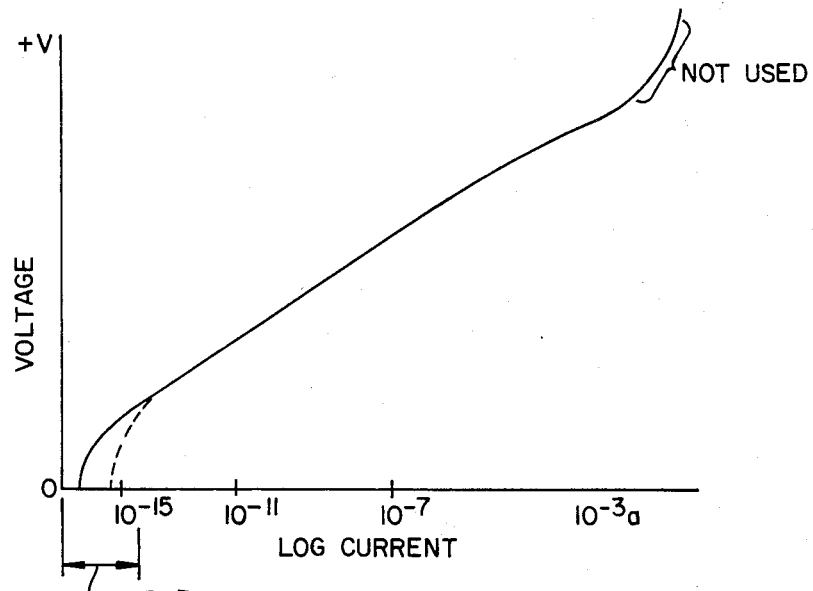
FIG._3.

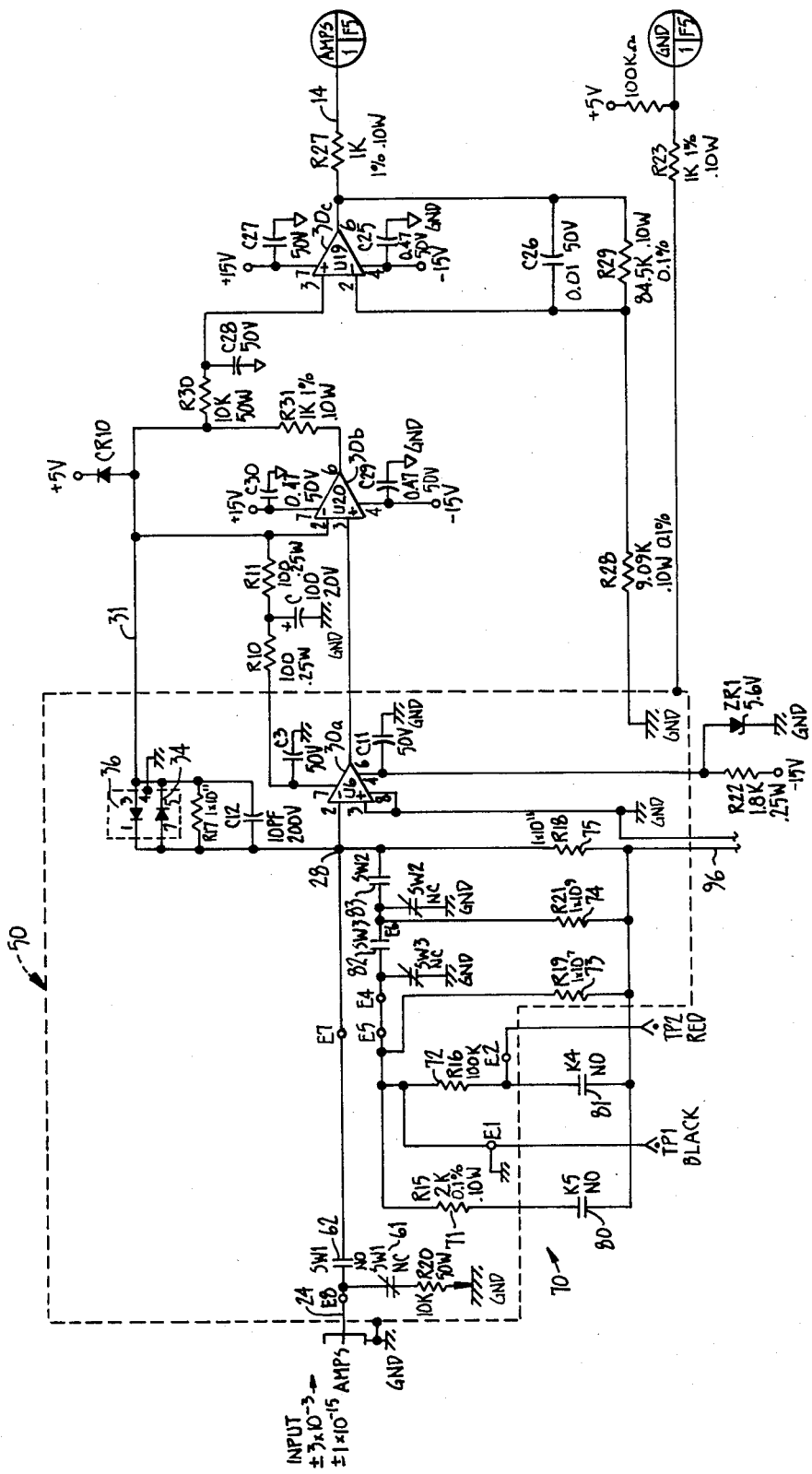
FIG._4a.

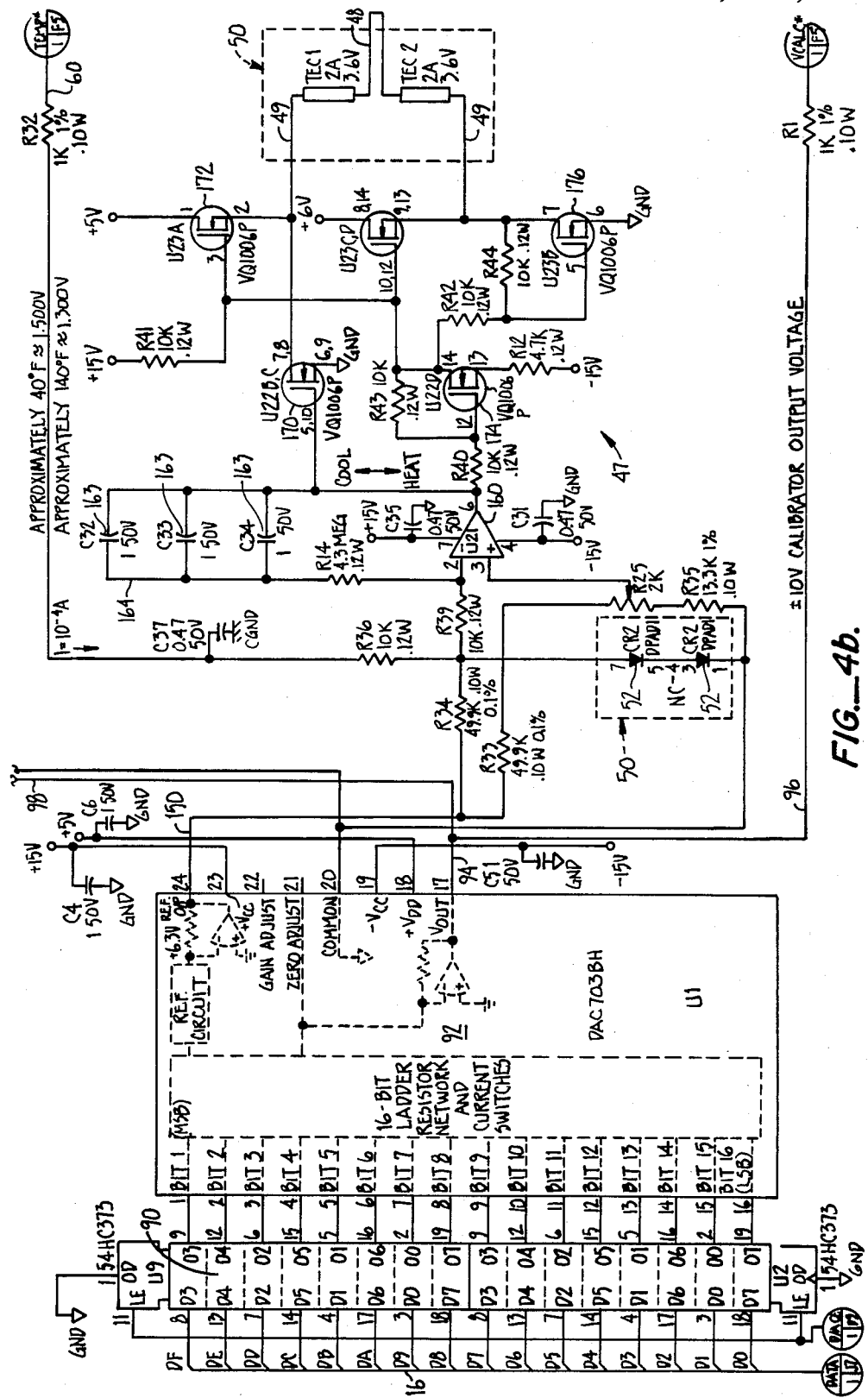
FIG._4b.

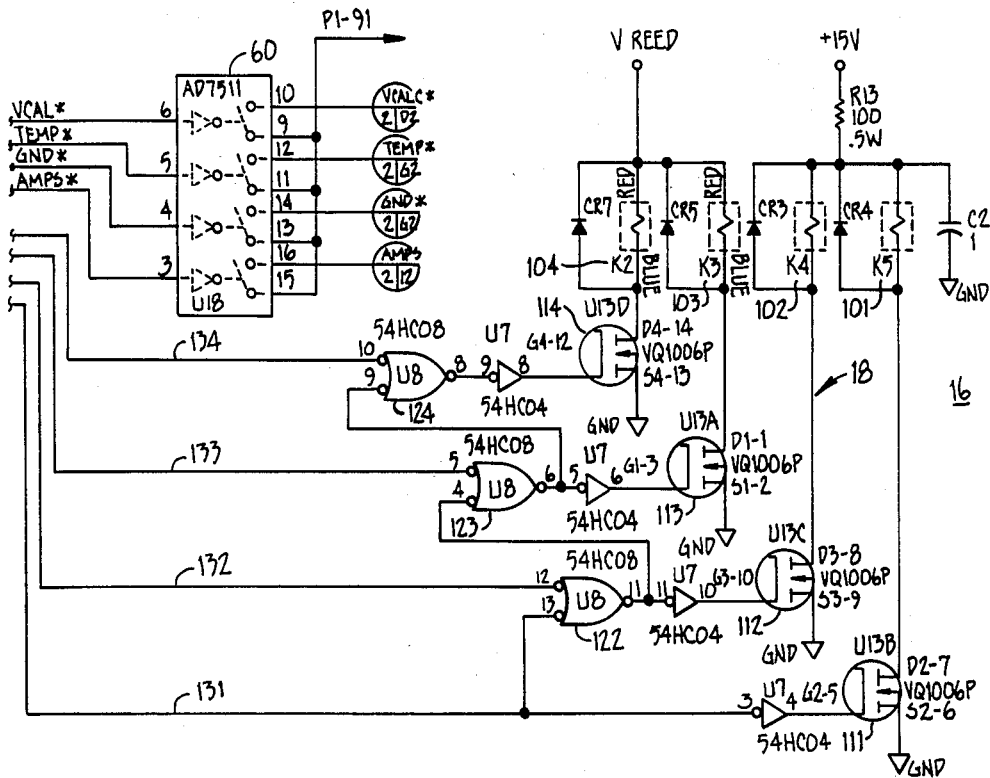
FIG._4c.

FEMTOAMMETER

BACKGROUND OF THE INVENTION

1. Field of the Invention

This invention relates to ammeters and particularly to a femtoammeter for measuring currents in the range of $10^{-15}$ amperes.

Femtoammeters measure incredibly small currents. Unfortunately, the small currents measured are oftentimes smaller than the noise transients which can be anticipated within the ammeter. Conventional ammeter circuitry can easily give erroneous readings.

Femtoammeters find application in sensitive instrumentations in nuclear power plants such as main steamline radiation monitors, out of core wide range radiation monitors, out of core intermediate range monitors, and area and process radiation monitor functions.

Where ammeters are placed in these locations, they simply cannot be off line for inordinate periods of time. Ammeter reliability must be high; the instruments must not be inoperative due to transients. Moreover, the instrument must not cause false readings, as false readings cause nuclear power plants to go off line and lose operating revenues.

2. Summary Of The Prior Art

Referring to FIG. 1, a typical ammeter circuit is disclosed. An input 14 connects to a leg 15 of an amplifier 16. A constant current source 18 passes through a temperature compensating log diode 19 connected to the negative input of amplifier 16. A log diode 19 connected in the feedback loop 20 of the amplifier 16 controls amplifier output through a digital-to-analog converter 25.

In operation, log diode 19 tailors the output of ammeter 16 so that currents from about $10^{-13}$ to $10^{-3}$ amps may be log plotted against the voltage typically from 0 to 1 volts.

Such circuitry has had difficulty in the femtoammeter environment. First, because of the extremely small currents, normally measured voltage transients reverse bias amplifier 16. When amplifier 16 is reversed biased, only leakage through log diode 19 can reinstate positive bias to amplifier 16. Time constants of reinstatement in the order of 10,000 seconds (two hours, forty minutes) can be anticipated. In many modern instrument environments such recovery periods are wholly unacceptable.

SUMMARY OF THE INVENTION

A femtoammeter is disclosed which resists noise induced reversed bias of the ammeter amplifier and avoids long time constant recovery with unusually high measurement accuracy. The amplifier ammeter has a feedback loop which is provided with paired opposingly faced log diodes in parallel across the feedback circuit. Transients of negative or positive bias are accommodated without biasing the amplifier to a reverse polarity and having unacceptably long time constant recovery. Conventional temperature compensation, not possible with the parallel reversed diode configuration, is supplied by heat sinking the ammeter components, providing a log diode temperature sensor for the heat sinked components and controlling the heat sink operation temperature with a thermoelectric cooler. The temperature sensing log diodes output to a computer lookup table. The same temperature sensing log diode outputs to a bridge circuit operating the thermoelectric cooler. The thermoelectric cooler is polarized to heat or cool the heat sink to thermally adjust the ammeter to an optimum operating temperature. Automated bootstrap calibration is disclosed with reed switching for prevention of stray currents. Accuracy includes heretofore unattainable results.

OBJECTS AND ADVANTAGES OF THE INVENTION

An object of this invention is to disclose a femtoammeter circuit in which reverse biasing of the amplifier by transient noise is provided with an acceptable recovery time constant. According to this aspect of the invention, an amplifier is provided with an input to a first leg with a reference voltage to a second leg. A feedback loop is provided from the amplifier output to the input leg and provided with paired opposing log diodes connected in parallel across the loop. Voltage transients biasing the amplifier negatively or positively are provided with rapid recovery paths through the log diodes.

An advantage of this aspect of the invention is that the resultant ammeter may be reliably used with sensitive safety instrumentation. Long down times due to recovery from transients are avoided.

Unfortunately, the disclosed parallel and opposed log diodes have a secondary effect. They render completely inoperative temperature compensation circuits such as temperature compensating log diode 19 of FIG. 1. This being the case, it is a further object of this invention to provide a temperature control for a femtoammeter. According to this aspect of the invention, the first and most sensitive amplification stage of the femtoammeter is enclosed within a heat sink. Two log diodes connected in series are provided with a constant current input. These log diodes output as a direct effect of the first order, a voltage which is directly proportional to temperature. The output voltage is compared at a bridge circuit. The bridge circuit output goes to a thermoelectric cooler biasing the cooler to heat the sink where the sink temperature is too low, and biasing the cooler to cool the sink where the sink temperature is too high.

An advantage of this aspect of the invention is that operating temperature of the ammeter amplifier is accurately controlled.

A further advantage of the log diode temperature sensing is that a direct output of heat sink temperature is provided. This output of heat sink temperature can adjust the ammeter output calibration on a real time basis. Such calibration can occur through three dimensional lookup tables selected on the basis of current and operating temperature.

An advantage of this aspect of the invention is that not only is the ammeter read in real time for its present operating temperature, but long term thermal movement to and towards an optimum operating temperature is enabled.

A further aspect of this invention is to disclose a bootstrap calibration system computer operated for periodically calibrating the ammeter. According to this aspect of the invention, a reference resistance placed in parallel with gross resistive values calibrates the ammeter at sequential operating levels approximately two magnitudes apart over a range of six magnitudes. Magnetic switching of the bootstrapping resistors avoids stray current in the ammeter and assures regular automated calibration.

An advantage of the disclosed bootstrap calibration is that the three dimensonal lookup table is recreated at each calibration. Consequently, the instrument is calibrated substantially concurrently with each use.

The entire ammeter operates with a level of accuracy to within ±1% at $10^{-13}$ amps. Reliable instrument operation results.

Other objects, features and advantages of this invention will become more apparent after referring to the following specification and attached drawings in which:

BRIEF DESCRIPTION OF THE DRAWINGS

FIG. 1 is a circuit diagram of the prior art;

FIG. 2 is a circuit schematic of the femtoammeter circuit of this invention;

FIG. 3 is a graph illustrating the output range of the disclosed femtoammeter; and FIGS. 4A, 4B and 4C are an actual electronic circuit diagram component labelled for implementing the preferred embodiment of this invention.

DESCRIPTION OF THE PREFERRED EMBODIMENTS

Referring to FIG. 2 the invention is schematically described.

Referring to FIG. 2, input 24 passes through a summing point 28 to the leg of an amplifier 30. Amplifier 30 has an output through an A-to-D converter 14. D-to-A converter 16 provides summing point 18 with a temperature compensated input.

Amplifier 30 is provided with a feedback loop 31 which feedback loop includes opposed log diodes 34, 36 to allow amplifier 30 to operate in either polarity while permitting acceptable recovery times from inevitable voltage transients. A $10^{11}$ ohm resistor 38 and a small capacitor 32 (10 picofarads) form the remainder feedback loop for amplifier 30 for damping amplifier vibration.

Amplifier 30 is contained within a heat sink 42. Heat sink 42 has its temperature measure by constant current log diodes schematically shown at 45 outputting a voltage which is a function of temperature. This voltage is used for comparison at a bridge circuit 47 for powering of a thermoelectric cooler 48. Comparison at bridge circuirt 47 biases circuit output. Where heat sink 42 temperature is too high, current to thermoelectric cooler 48 is operated to cool the heat sink. Where heat sink 42 temperature is too low, current is reversed to the thermoelectric cooler 48 to raise the temperature of the heat sink.

At the same time, the output of constant current temperature sensing diodes 45 is converted to a digital value and used to address lookup tables. The digital converter 14 causes the computer control to address an appropriate lookup table adjusted in real time to the desired current level. There results ammeter output which is substantially continuous and calibrated to reliable levels.

Referring to FIG. 4A the main operating circuitry is illustrated. FIG. 4A includes an input 24 and an output 14. Input 24 is connected to summing point 28. Reverse diodes 34, 36 complete a feedback loop 31 through paired amplifer 30A and 30B. Output occurs through a final amplifier 30C to the output 14 for conversion.

It will be observed that the first amplification stage 30A is the only stage enclosed in the heat sink. This amplifier is operated at low gain to maintain all heat loss low.

It will be observed that the instrument includes a large heat sink 50. As will be hereinafter more fully explained, heat sink 50 is shown in FIG. 4A and again in FIG. 4B at two other discrete locations 50. In FIG. 4A it surrounds the operating circuitry of the amplifier and the first stage amplifier 30A. In FIG. 4B it includes temperature measuring diodes 52 and theremoelectric cooler 48. In the assembled embodiment, all heat sink surrounded circuitry is assembled in the same heat sink.

The thermoelectric cooler senses heat output from the diodes 52. This passes through a bridge circuit generally denominated 47 to operate the cooler 48 through paired leads 49. At the same time the diodes output a reading of temperature at line 60 to the computer for use with computer operated lookup tables.

Referring to FIG. 4C conventional circuitry is illustrated. A protected analog switch 60 receives selective inputs including calibration voltage, temperature output and amperes measurement. These signals are routed to standard computer components (not shown).

Additionally, switching for relays used in the bootstrap calibration to be hereinafter discussed is set forth.

Referring to FIG. 4A, heat sink 50 encloses the main operating elements. Input 24 is switched at switches 61 from ground and switch 62 to summing point 28 for actual measurement. There is provided at 70 a bootstrap calibration network.

Bootstrap calibration network includes calibration resistors 71, 72, 73, 74, 75 all connected in parallel. Respective switches 80, 81, 82 and 83 are opened one after the other to place across the parallel circuit variable resistances.

Referring briefly to FIG. 4B, digital data from bus 16 is latched at latch 90 and thereafter released to a sixteen bit digital-to-analog converter 92. Converter 92 puts a reference voltage out on line 94. This reference voltage is sent to the computer at 96 for current measurement, for calibration purposes including calculating three dimensional memory tables as well as passed to the bootstrap calibration network via line 98.

Referring briefly to FIG. 4C, it can be seen that respective coils 101, 102, 103 and 104 are utilized to provide magnetic fields. These respective magnetic fields operate reed switches at 80, 81, 82 and 83 interior of or near the heat sink. These respective reed switches prevent switches from generating heat or currents inside the heat sinks or contained wiring that might otherwise upset the measurements being made.

Referring again to FIG. 4C, quad moss power arrays 111, 112, 113 and 114 are illustrated. These arrays receive output signals from a computer through respective gates OR 122, 123, 124.

The reader can observe that a signal on line 131 will close power arrays 11, 112, 113 and 114. Further, when the actuating signal (presumably a low) is applied to 132 and not 131, switch 80 wil open and 82, 83, 84 will remain closed. When the signal is applied at line 133 switches 83, 84 will remain closed. When the signal is applied at line 134 only switch 84 will remain closed.

Returning to FIG. 4A and to the bootstrap calibration system there illustrated, this calibration system can now be understood.

Broadly, calibration at maximum current occurs with switch 62 open and switches 80, 81, 82 and 83 closed. In this case resistor 71 dominates the parallel circuit and the digital-to-analog converter 92 puts through a calibrating voltage.

Switch 80 is first opened. At this point, resistor 72 dominates and an exact calibration voltage is placed through the circuit by digital-to-analog converter 92. This voltage is applied first to cause maximum tolerable current flow and therafter applied at a level of 1/100th of the maximum flow. This latter 1/100 value is recorded in the memory of the computer.

Thereafter, switch 81 is open. In this case, resistor 73 dominates. But voltage to force a full current flow and thereafter 100th current flow is again applied. Finally, switch 82 is open and the process repeated with resistor 74. Thereafter, switch 83 is opened and the process repeated with resistor 75.

The calibration occurs over a lengthy period of time, about 45 minutes. Differing voltages (current levels) are all tested. Writing of results occurs to a three dimensional lookup table. This lookup table includes inputs relating to the temperature of the heat sink, the range of voltages output from the digital-to-analog converter as well as the range of currents being measured.

Bootstrap calibration such as that illustrated has theretofore been done manually on such instruments. The reader will understand that in this instrument it is computer actuated.

Referring to FIG. 4B, paired series connected log diodes 52 are connected to a precision power supply on line 50 from the digital-to-analog converter 92. Leakage past these diodes is a direct effect of temperature at 3.2 millivolts per degree Centigrade. An exact reference voltage of 1.40000 volts is output on the power supply and compared at amplifier 160. Amplifier 160 is provided with capacitors 163 and parallel feedback loop 164. The capacitors in parallel impart to amplifier 160 a very long recovery time to dampen oscillation.

The comparison at amplifer 160 is output to a bridge circuit network 47. In the case of the heat sink being of too high a temperature, the diode voltage is lower than the reference. This being the case, output through power arrays 170, 172 causes current to flow in a cooling mode through the thermoelectric cooler 48. Conversely, wherein excessive heat condition is detected as the diode voltage being higher than the reference voltage output occurs at 174, 176, 178. Current flows in an opposite direction to effect cooling.

It will be appreciated that any comparing bridge circuit will be sufficient, the one here labeled with actual components follows the design of the actual circuit utilized in practice.

Assuming that calibration has occurred and actuation of the heat sink has been made to bring the cooler to the desired cool states, the measurement of a current can now be discussed.

Typically, current is input at 24 and switch 62 closed with switch 61 open. Assuming the instrument is in full calibration, current flow to the summing point 28. At the summing point 28, respective amplifiers 30A and 30B are biased through the feedback loop 31. Output occurs through a second stage 30C and to an output 14.

At the same time, temperature at line 60 is supplied to the main computer. Given the temperature and the current, computer lookup tables (not shown) are consulted for the final output.

We claim:

1. A femtoammeter comprising in combination:
    an amplifier having a first leg connected to an input and a second leg to a reference standard voltage;
    said amplifier having an output and a feedback loop from said output to said input leg;
    first and second log diodes placed in parallel across said feedback loop, said first diode being opposed in direction to said second diode, said respective diodes being provided in a heat sink to maintain said diodes at a relatively constant temperature;
    at least one temperature sensor connected to said heat sink, said temperature sensor outputting a signal to indicate in real time the operating temperature of said amplifier for calibrating said amplifier output in real time.

2. The femtoammeter of claim 1 and including a thermoelectric heater and cooler connected to said heat sink and means for operating said cooler at a polarity to selectively heat or cool said heat sink responsive to the output of said temperature sensor.

3. The invention of claim 2 and wherein:
    said means for operating said thermoelectric cooler includes a standard voltage source;
    means for comparing said standard voltage source to a voltage generated by a temperature sensor including at least one log diode;
    bridge circuit means for outputting current to said thermoelectric cooler, said bridge circuit means connected to output current in a first polarity upon excessive temperature to cool said heat sink and outputting current in a second polarity to heat said heat sink responsive to said comparing means.

4. A femtoammeter comprising in combination with an amplifier having at least two amplifier inputs:
    a first input connected to a current measuring input and a second input to a reference standard voltage, said amplifier having an output and a feedback loop from said output to said current measurement input;
    first and second log diodes placed parallel across said feedback loop, said first diode being opposed in direction to said diode, said respective first and second diodes being provided in a heat sink to maintain said diodes at a relatively constant temperature;
    a thermoelectric cooler attached to said heat sink;
    at least one temperature sensor connected to said heat sink, said temperature sensor having a first output outputting a signal to indicate the operating temperature of said amplifier; and
    means operatively connected between said temperature sensor at said first output and said thermoelectric cooler for cooling or heating said heat sink towards an optimum operating temperature.

5. The invention of claim 4 and wherein said means operatively connected between said temperature sensor and said thermoelectric cooler includes a bridge circuit operable to output voltage of a first polarity in response to reduced current caused by high temperature of said heat sink and operative to output voltage of a second polarity in response to reduced temperature of said heat sink whereby said thermoelectric cooler cools or heats said heat sink towards said optimum operating temperature.

6. The invention of claim 4 and including:
    a second output from said temperature sensor, said second output outputting to a lookup table;
    an analog-to-digital converter connected to the output of said amplifier, the digital output of said converter addressing a lookup table compensated for the real-time operating temperature of said amplifier.

7. A femtoammeter comprising in combination an amplifier having a first leg connected to an input and a second leg connected to a reference standard voltage:
  said amplifier having an output and a feedback loop to said input leg;
  first and second log diodes placed in parallel across said feedback loop, said first diode being in opposed direction to said second diode, said respective diodes being provided in a heat sink to maintain said diodes at a relatively constant temperature;
  at least one temperature sensor connected to said heat sink, said temperature sensor having at least first and second temperature sensor outputs;
  said first temperature sensor output having a signal to indicate the operating temperature of said amplifier for calibrating said amplifier output;
  said second temperature output having operative connection to circuit control means for producing a first polarity output from said circuit control means at a first range of temperatures and a second polarity output at said circuit control means at a second range of temperatures; and
  a thermoelectric cooler connected to said circuit control means for maintaining said heat sink in a preselected temperature range responsive to heating and cooling of said thermoelectric cooler.

* * * * *